United States Patent
Ahn et al.

(10) Patent No.: US 9,722,550 B2
(45) Date of Patent: Aug. 1, 2017

(54) POWER AMPLIFYING RADIATOR (PAR)

(71) Applicant: Hoon Ahn, Setauket, NY (US)

(72) Inventors: Hoon Ahn, Setauket, NY (US); Erich Enrique Kunhardt, Llyod Harbor, NY (US)

(*) Notice: Subject to any disclaimer, the term of this patent is extended or adjusted under 35 U.S.C. 154(b) by 36 days.

(21) Appl. No.: 14/545,336

(22) Filed: Apr. 22, 2015

(65) Prior Publication Data

US 2015/0303560 A1  Oct. 22, 2015

Related U.S. Application Data

(60) Provisional application No. 61/982,558, filed on Apr. 22, 2014.

(51) Int. Cl.
| | | |
|---|---|---|
| *H01Q 1/50* | (2006.01) |
| *H03F 3/19* | (2006.01) |
| *H01Q 21/00* | (2006.01) |
| *H03F 3/21* | (2006.01) |
| *H03F 3/24* | (2006.01) |

(52) U.S. Cl.
CPC .......... *H03F 3/19* (2013.01); *H01Q 21/0025* (2013.01); *H03F 3/211* (2013.01); *H03F 3/245* (2013.01); *H03F 2200/451* (2013.01)

(58) Field of Classification Search
None
See application file for complete search history.

(56) References Cited

U.S. PATENT DOCUMENTS

| | | |
|---|---|---|
| 4,360,813 A | 11/1982 | Fitzsimmons |
| 4,490,668 A | 12/1984 | Sterzer |
| 4,837,484 A | 6/1989 | Eliasson et al. |
| 5,013,959 A | 5/1991 | Kogelschatz |
| 5,019,830 A | 5/1991 | Harada |
| 5,049,777 A | 9/1991 | Mechtersheimer |
| 5,198,717 A | 3/1993 | Kogelschatz |

(Continued)

FOREIGN PATENT DOCUMENTS

CN   203312432 U   11/2013

OTHER PUBLICATIONS

PCT International Search Report and Written Opinion for PCT/US15/00049 dated Sep. 14, 2015.

(Continued)

*Primary Examiner* — Trinh Dinh
(74) *Attorney, Agent, or Firm* — Carter, DeLuca, Farrell & Schmidt, LLP

(57) ABSTRACT

A power amplifying radiator is disclosed that includes an electric field receiver or radio frequency (RF) energy coupling and impedance matching element, a capacitive coupler, a cavity combiner including a coaxial-cavity section providing electromagnetic communication with the capacitive coupler, and a phased-array antenna/one or more phased-array antennas. The RF energy coupling and impedance matching element is in electromagnetic communication with the one or more phased-array antennas via the cavity combiner. The cavity combiner includes a center conductor configured and disposed to project from the coaxal-cavity section such that the cavity combiner defines a co-axial cross-sectional configuration. The power amplifying radiator may be included within a high power microwave system.

11 Claims, 14 Drawing Sheets

(56) References Cited

U.S. PATENT DOCUMENTS

| | | | |
|---|---|---|---|
| 5,214,344 A | | 5/1993 | Kogelschatz |
| 5,386,170 A | | 1/1995 | Kogelschatz |
| 5,432,398 A | | 7/1995 | Kogelschatz |
| 5,471,220 A | | 11/1995 | Hammers et al. |
| 5,497,050 A | | 3/1996 | Cheo |
| 5,558,800 A | | 9/1996 | Page |
| 6,023,612 A | * | 2/2000 | Harris .................. H01P 1/2138 330/295 |
| 6,292,143 B1 | | 9/2001 | Romanofsky |
| 6,724,261 B2 | | 4/2004 | Cheo |
| 6,898,419 B1 | * | 5/2005 | Fayeski ................ H03J 1/0008 455/120 |
| 2006/0270368 A1 | | 11/2006 | Caimi et al. |

OTHER PUBLICATIONS

PCT International Preliminary Report on Patentability for PCT/US2015/000049 dated Nov. 3, 2016.

\* cited by examiner

POWER AMPLIFYING RADIATOR (PAR)

CROSS-REFERENCE TO RELATED APPLICATIONS

This application claims the benefit of, and priority to, U.S. Provisional Patent Application No. 61/982,558 by Hoon Ahn et al., "POWER AMPLIFYING RADIATOR (PAR)", filed on Apr. 22, 2014, the entire contents of which is incorporated by reference herein.

BACKGROUND

1. Technical Field

The present disclosure is in the field of generation and transmission of high power radio frequency (RF) energy using phase-array antenna technology. More particularly, the present disclosure is directed to a power amplifying radiator (PAR) element with characteristic dimensions of the order of the cell size of the array.

2. Description of Related Art

FIG. 1 illustrates a benchmark system 10 for generating a directed beam of high power microwave (HPM) radiation that includes a high-power tube-type microwave prime power source 16, e.g. TWTs, Vircator, Gyrotron, etc, a pulse shaping network 18, and associated circuitry in the form of a vacuum tube-type HPM generator 20 and controller 22 driving a single element antenna 14. The functional block diagram of this system in FIG. 1 provides a sense of scale and portability, as the system 10 is mounted on a wheeled convoy vehicle 11. A desirable characteristic of this system is having very high Effective Radiated Power (ERP). However, although reasonably efficient, the system 10 is bulky, heavy and directivity is achieved by rotating the antenna 14, via the rotating mount 12, thereby adding further complexity and limitations regarding pointing agility. Moreover, since the system 10 operates at high voltages, it requires special components, including heavy, high voltage cables and concomitant handling issues.

FIG. 2 illustrates a system 50 in which the single-element antenna 14 of FIG. 1 is replaced with a phased-array 52 mounted on a convoy vehicle 51 that is even heavier and larger than convoy vehicle 11 in FIG. 1. Phased-array system 50 can lead to considerable increase in ERP (factors of 100s over single-element radiator) and pointing agility allowing electronic beam steering, but this is achieved at a cost of increased weight and complexity. The complexity and weight increase in this approach over the single antenna-element 14 of FIG. 1 comes partly from the specialized power distribution system 54 needed to connect the HPM generator 56 to the phased array antenna 52.

SUMMARY

The present disclosure is directed to an element of a high power phase-array system. More particularly, the present disclosure is directed to a power solid-state RF amplifier and an antenna as components of an integrated Power Amplifying Radiator (PAR) element. Integration of these components means: 1) the characteristics of the amplifier component are determined by the impedance of the antenna component; and 2) amplifier and antenna components share physical parts.

Moreover, the footprint of the amplifier component of PAR is the same as the antenna component and equal to the size of the phase-array cell when it is applied to form an array of the PAR. The integrated unit eliminates the need for a separated RF amplifier-array and the impracticability of having connecting cables between amplifier-array and antenna-array elements, which give rise to power losses and impose physical constraints. Because of PAR, the phase-array system design can be feasibly developed into a practicable system.

The present disclosure relates, in one embodiment, to a high power microwave system that includes a power amplifying radiator that includes a RF energy coupling and impedance matching element, a capacitive coupler, a cavity combiner providing electromagnetic communication with the capacitive coupler and an antenna, wherein the RF energy coupling and impedance matching element is in electromagnetic communication with the antenna via the cavity combiner.

The system may include a power amplifying radiator driver in electromagnetic communication with the power amplifying radiator, wherein the cavity combiner has a cross-sectional dimension equal to a unit cell dimension of the phased-array antenna. The capacitive coupler excludes dielectric material and a magnitude of an electric field propagating through the coupler is such that the magnitude of the electric field is less than a breakdown voltage of the electric field propagating through the capacitive coupler.

The power amplifying radiator driver provides power input to the cavity combiner wherein the power in the cavity combiner is greater than the power to the antenna. The power amplifying radiator driver may include an arborescent 1:N distributor embedded in a multi-layered disk, N interconnecting strip lines embedded in the multi-layered disk, N respective impedance transformers and N transistors, each receiving an electrical signal from the respective N impedance transformers. The N impedance transformers match output impedance of the N interconnecting strip lines to input impedance to the respective N transistors, the output impedance of the N interconnecting strip lines being greater than the input impedance to the respective N transistors. The power amplifying radiator driver may further include N biasing circuitry in electrical communication with the respective N transistors each receiving an electrical signal from the respective N impedance transformers.

The respective N transistors that each may receive an electrical signal from the respective N impedance transformers may be 10 transistors each receiving an electrical signal from respective 10 impedance transformers.

In one embodiment, the antenna is a horn antenna, or in one embodiment, the antenna is a patch antenna.

The present disclosure relates, in one embodiment, to power amplifying radiator that includes a RF energy coupling and impedance matching element, a capacitive coupler, a cavity combiner providing electromagnetic communication with the capacitive coupler and an antenna, wherein the RF energy coupling and impedance matching element is in electromagnetic communication with the antenna via the cavity combiner.

In one embodiment, the present disclosure relates also to a high power solid state amplifier that includes low power strip-line power distributor, high power cavity combiner, and N power-transistors coupled to the low power strip-line power distributor, wherein the high power solid state amplifier drives an input power and combines output powers of the N power-transistors yielding an output power that is greater than input powers to the N power-transistors, and wherein the high power cavity combiner is coupled to an antenna component through a capacitive coupler.

BRIEF DESCRIPTION OF DRAWINGS

The above-mentioned advantages and other advantages will become more apparent from the following detailed description of the various exemplary embodiments of the present disclosure with reference to the drawings wherein.

DETAILED DESCRIPTION

The embodiments of the present disclosure relate to a non-obvious high power microwave system that is self-contained (with all necessary subsystems and capability to operate without requiring any external input), directed (based on a phased-array antenna architecture), and solid-state driven HPM prototype system for vehicle based (such as a Humvee) non-lethal counter-electronic missions. The system is designed around a phased-array antenna, operating at a frequency in L-band (1-2 GHz) and with a specified effective radiated power (ERP). The system may be designed with certain modifications, not shown or described herein, to operate in the S-band (2-4 GHz) and also with a specified ERP.

In the embodiments of the HPM system according to the present disclosure, an electronic beam steering scan angle is designed to be about +45 degrees. RF pulse operating parameters (pulse width and duty cycle) are designed to a specified pulse width with a duty cycle.

Figure 1:
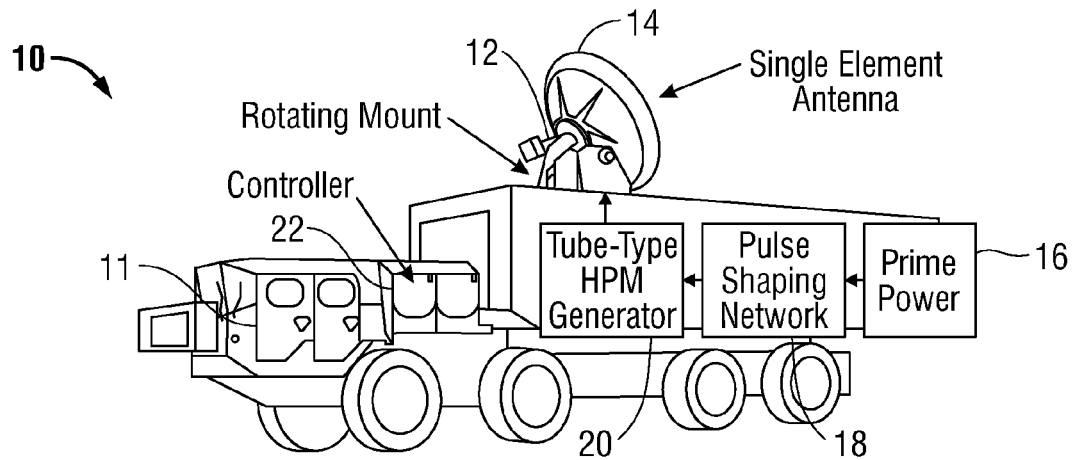
FIG. 1 is a functional block diagram of a directed HPM generating system with a dish antenna as a radiating element according to the prior art.
Figure 2:
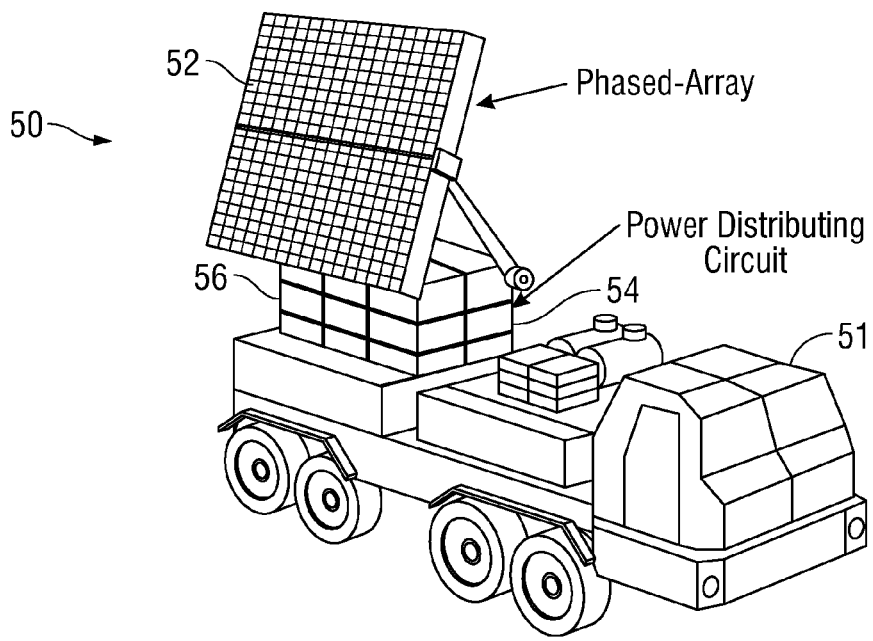
FIG. 2 is a schematic diagram of a directed HPM generating system with a phased-array as radiating element according to the prior art.
Figure 3:
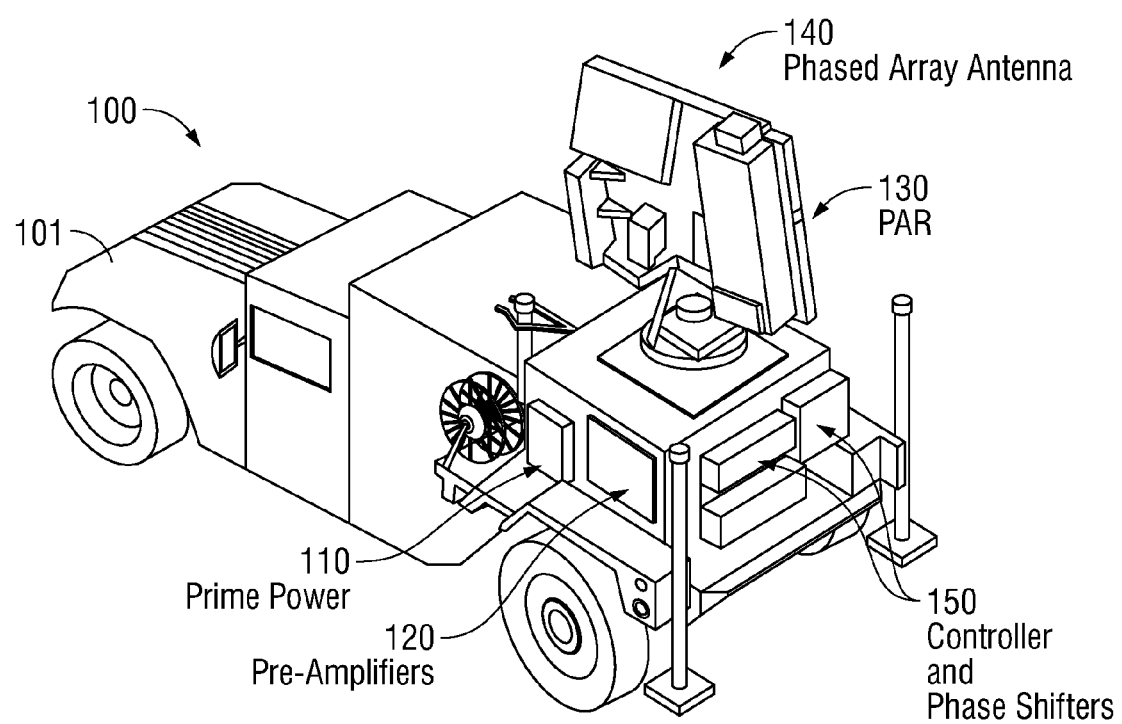
FIG. 3 is a perspective view of a directed HPM generating system that includes power amplifying radiator (PAR) technology according to one embodiment of the present disclosure.

FIG. 3 illustrates a HPM system 100 that includes power amplifying radiator (PAR) features according to one embodiment of the present disclosure mounted on vehicle 101. More particularly, HPM system 100 includes a prime power source 110 that supply power to pre-amplifiers 120, a PAR 130, and a phased-array antenna 140. System control is provided by controller and phase shifters 150. The PAR 130 includes a solid-state HPM Cavity Combiner-Antenna unit with a low impedance driver operating at 50 V that is described in more detail in FIGS. 4-12. The PAR is highly efficient (can range from 50%-90% depending on the transistors used as drivers and in their mode of operation), compact (spatial scale of a few cm), and light-weight (order of about 1.4 kg (about 3 lbs.). The PAR is the integration of a high power solid state amplifier section (HPSSA) and antenna sections into a single "PAR unit" with a low impedance PAR driver.

Figure 4:
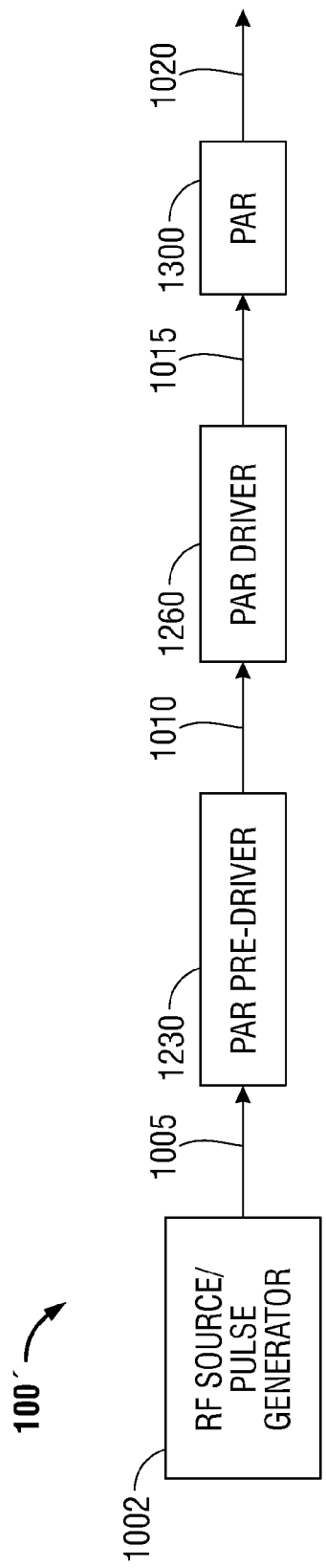
FIG. 4 is a simplified schematic block diagram of the directed HPM generating system of FIG. 3 that includes the power amplifying radiator (PAR) technology according to one embodiment of the present disclosure.

FIG. 4 is a simplified block diagram of the HPM system 100 of FIG. 3 that includes PAR includes power amplifying radiator (PAR) features according to one embodiment of the present disclosure. The detailed design of the PAR features illustrated in FIG. 4 are successively described in FIGS. 5-16 which follow. The HPM system 100 includes RF source pulse generator 1002 that generates RF pulsed waves 1005 that are received by PAR pre-driver 1230 that in turn is in electromagnetic communication with PAR driver 1260 to receive power input 1010 from the PAR Pre-Driver 1230. The power output from the PAR Driver 1260 is received by PAR 1300 as power input 1015. For the particular embodiment of HPM system 100 mounted on the type of vehicle 101 illustrated in FIG. 3, the PAR pre-driver 1230 may increase the power level of the RF pulsed waves 1005 from about 10 milliwatts (mW)/10 decibel-milliwatts (dBm) to, and may transmit the first increased power level 1010 to the PAR driver 1260 at, about 1.8 kilowatts (KW). The PAR driver 1260, in turn, may increase the power level 1015 received by the PAR 1300 to a power level as PAR output 1020.

Figure 5:
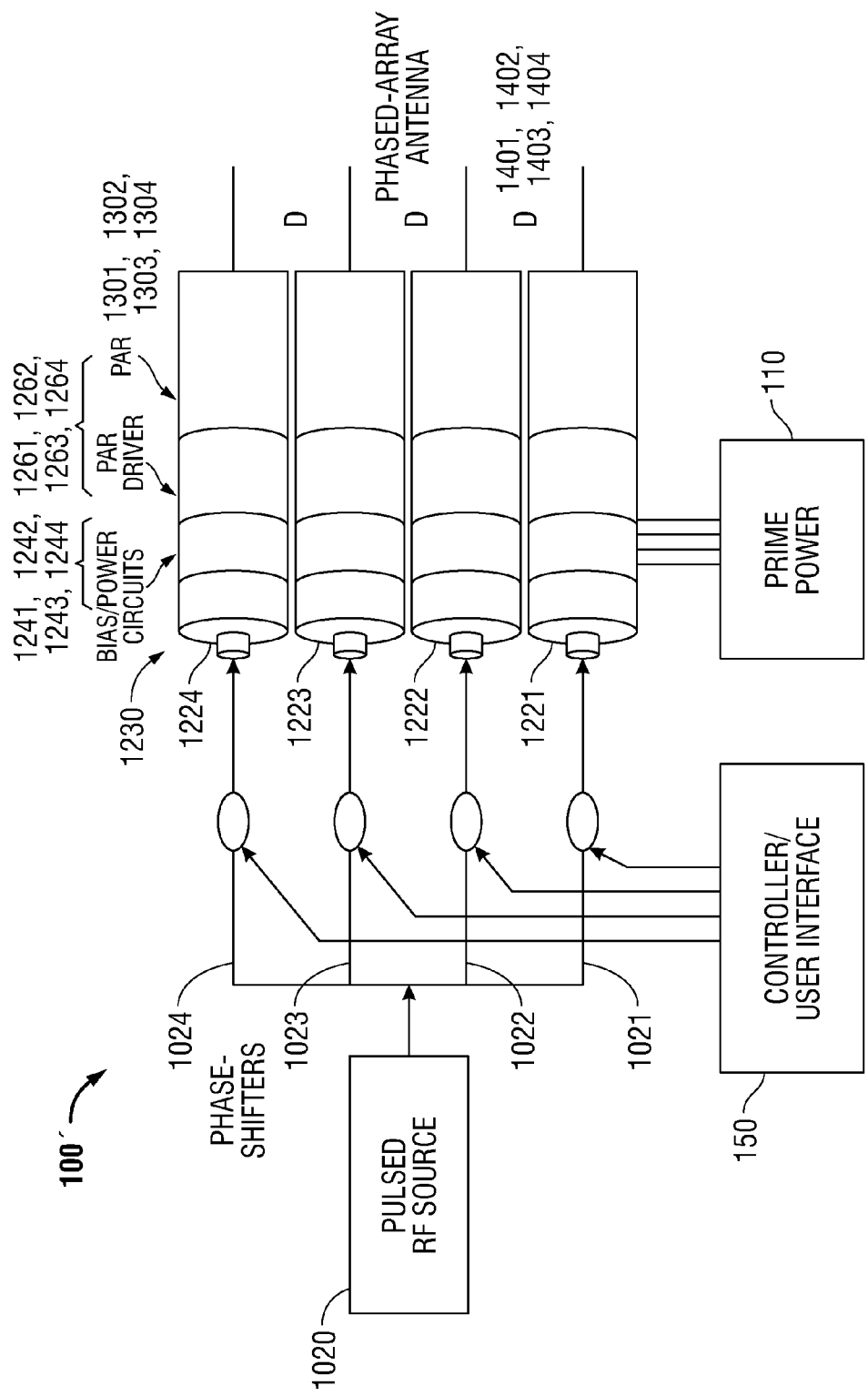
FIG. 5 is a functional block diagram of the HPM system driven by PAR technology according to one embodiment of the present disclosure.

In FIG. 5, HPM system 100' is the same as HPM system 100 in FIG. 3, except that the vehicle 101 is omitted. FIG. 5 is a more detailed version of FIG. 4 and includes RF source pulse generator 1002 that is in electrical communication with parallel phase shifters 1021, 1022, 1023, 1024, and that are in electrical communication with PAR pre-drivers 1221, 1222, 1223 1224 which, in turn, are successively in electrical communication with bias/power circuits 1241, 1242, 1243, 1244, PAR drivers 1261, 1262, 1263, 1264, PAR 1301, 1302, 1303, 1304 and phased-array antennas 1401, 1402, 1403, 1404, respectively. Electrical power is provided from a prime power source 110 and the phase shifters 1221, 1222, 1223, 1224 are controlled by controller/user interface 150. The prime power source 110 may include rechargeable batteries (not explicitly shown) that are charged by the vehicle 101.

Figure 6:
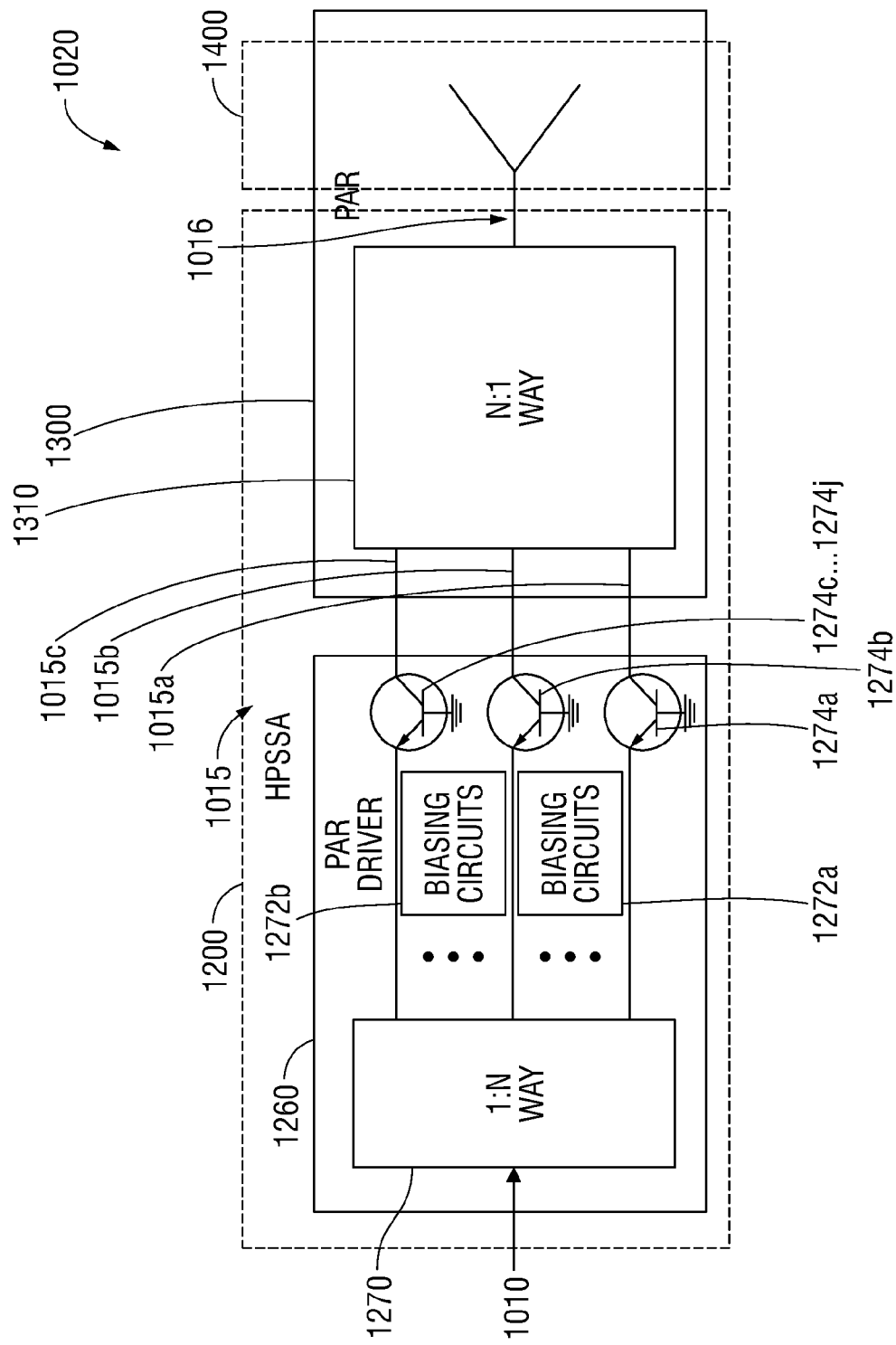
FIG. 6 is a functional block diagram of a PAR driver and PAR of the HPM system of FIGS. 4 and 5 according to one embodiment of the present disclosure.

FIG. 6 is a functional block diagram of the PAR Driver 1260 and PAR 1300. The PAR Driver 1260 and PAR 1300 are integrated as the output portion of a high power solid state amplifier (HPSSA) section 1200 and antenna section 1400 into a single "PAR unit" 1300 with a low impedance PAR driver 1260, all having the same footprint as shown in FIG. The size of the HPM system 100' footprint is that of the phased-array unit-cell spacing, dimension D. The PAR driver 1260 includes a 1:N way distributor 1270 that may be of the arborescent type, which since the distributor 1270 is in the low power section of the PAR driver 1260, is characterized by power losses in the distributor that are small (≤0.5 dB). Moreover, control of phase-characteristics in the distributor 1270 is within 5 degrees.

Figure 7:
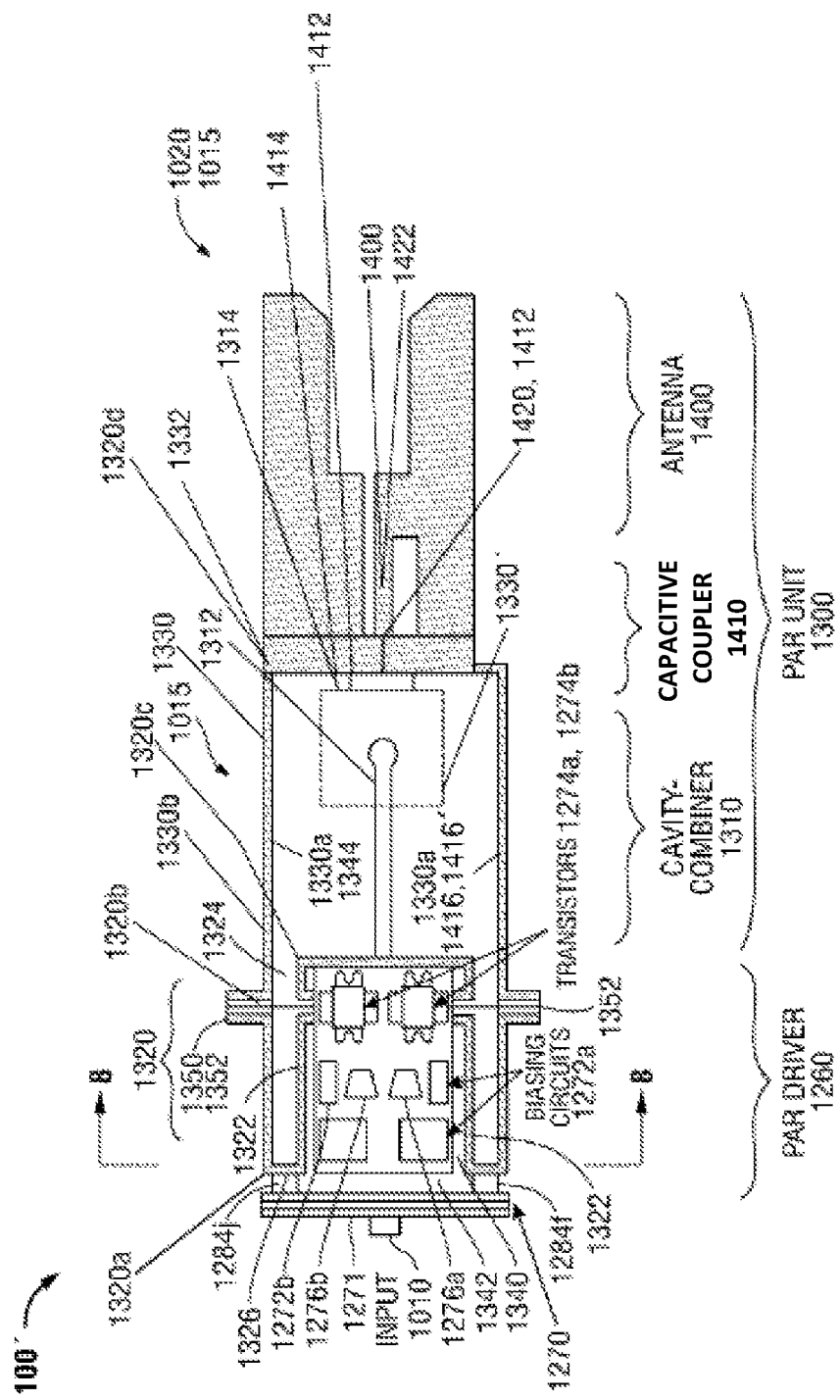
FIG. 7 is an elevation cross-sectional view of the PAR driver and PAR of FIG. 6 according to one embodiment of the present disclosure.
Figure 8:
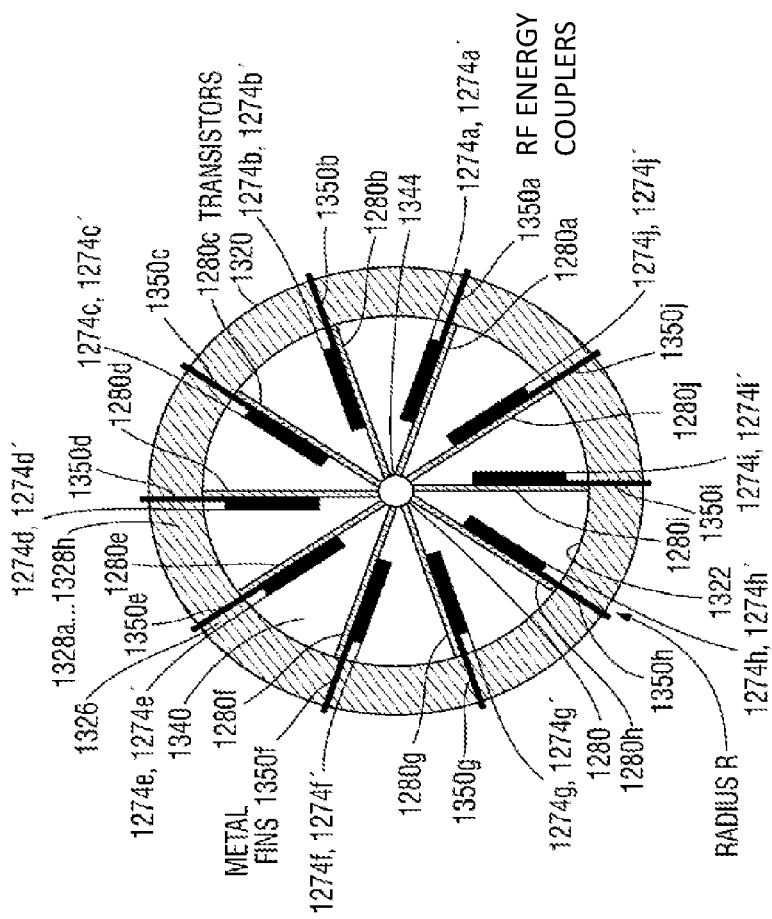
FIG. 8 is an axial or end cross-sectional view of the PAR driver of FIG. 8 taken along section-line 8-8 of FIG. 7 according to one embodiment of the present disclosure.
Figure 11:
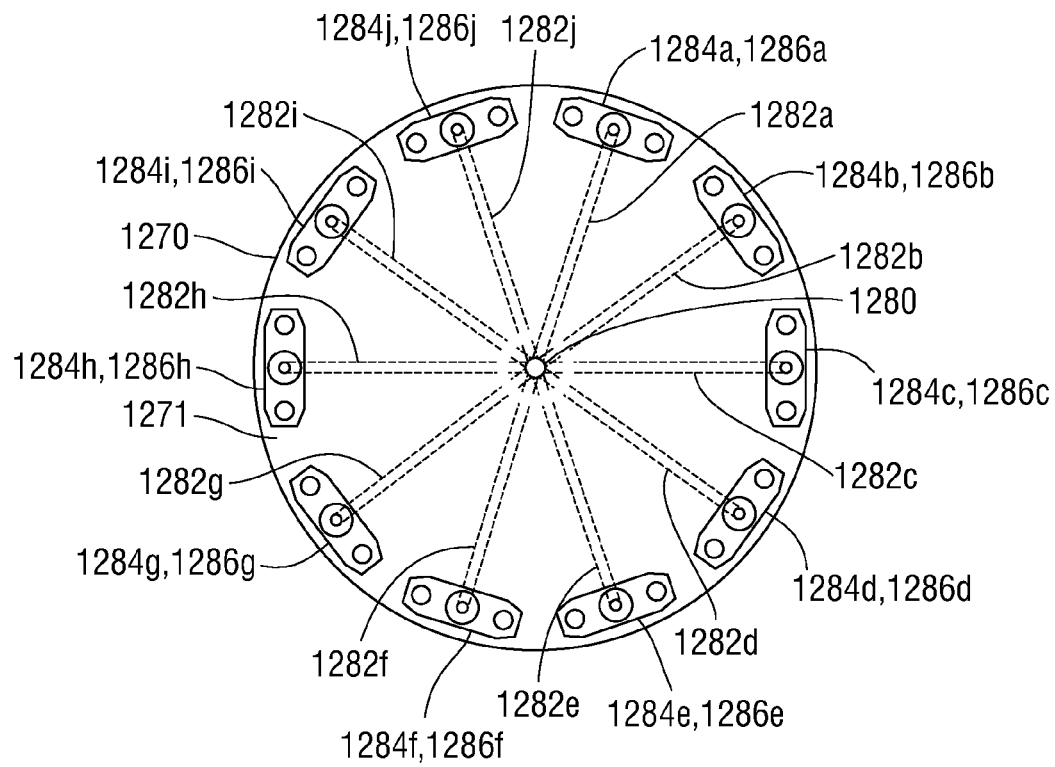
FIG. 11 is an axial view of a disk containing a 1:N arborescent driver shown in FIG. 7 according to one embodiment of the present disclosure.

Referring also to FIGS. 7 and 8, wherein FIG. 7 is an elevation cross-sectional view of the PAR Driver 1260 and PAR 1300 and FIG. 8 is a cross-sectional view of the PAR Driver 1260 and PAR 1300 taken along section line 8-8 in FIG. 7 with the 1:N way arborescent distributor 1270 not shown, at the power input 1010 includes 1:N way distributor 1270 mounted to proximal end 1320a of a λ/4 coaxial-cavity section 1320 that is formed within an interior volume 1330' of a cylindrical section 1330. The 1:N arborescent distributor 1270 is constructed as a multi-layered disk 1271, with impedance transformers 1276a . . . 1276j to match the input impedance of each of the PAR driver transistors 1274a, 1274b, 1274c . . . 1274j. The distributor 1270 operates at low power so that power losses are negligible. The distributor 1270 is mounted to λ/4 coaxial-cavity section proximal end wall 1326 that borders the λ/4 coaxial-cavity section 1320. As best shown in FIG. 11 below, the disk 1271 of the distributor 1270 is mounted to the proximal end wall 1326 via a series of mountings 1284a . . . 1284j that are intermittently positioned in proximity to the peripheral edge of the disk 1271. The proximal end wall 1326 is in the form of a ring-shaped disk that extends circumferentially around the proximal end of the cylindrical section 1330.

The λ/4 coaxial-cavity section 1320 extends from the proximal end 1320a to distal end 1320c of the λ/4 coaxial-cavity section 1320 within the interior volume 1330' of cylindrical section 1330. Inner wall 1330a of the cylindrical section 1330 defines an outer circumferential periphery of the λ/4 coaxial-cavity section 1320. An inner circumferential periphery of the λ/4 coaxial-cavity section 1320 is defined by an inner cylindrical wall 1322 such that the λ/4 coaxial-cavity section 1320 extends circumferentially around the inner wall 1330a to define an internal volume 132 between the inner wall 1330a of the cylindrical section 1330 and an inner cylindrical wall 1344 of the λ/4 coaxial-cavity section 1320.

The inner cylindrical wall 1322 of the λ/4 coaxial-cavity section 1320 further defines an internal volume 1340 within the λ/4 coaxial-cavity section 1320 of the cylindrical section 1330. The internal volume 1340 extends from the proximal end 1320a to distal end 1320c within the interior volume 1330' and defines an aperture 1342 at the proximal end 1320a that extends to circular wall 1344 at distal end 1320c. The PAR 1300 and PAR driver 1260 in the HPM system 100' may also be considered to be an antenna driven by a hybrid HPSSA, i.e., the HPSSA 1200, that includes a PAR driver arborescent 1:N distributor input 1010 and a PAR N:1 cavity combiner 1310 output 1016 with PAR driver transistors 1274a, 1274b, 1274c . . . 1274j as the amplifying elements (see FIG. 6). The PAR driver 1260 includes PAR driver impedance transformers 1276a and 1276b that interface with the PAR driver transistors 1274a, 1274b, 1274c . . . 1274j. The cavity-combiner 1310 is configured to include the λ/4 coaxial-cavity section 1320 and cylindrical section 1330. A capacitive coupler 1350 is positioned at a distance 1320b distally from power input end 1320a and proximal from the inner cylindrical wall 1344 of the λ/4 coaxial-cavity section 1320 to maximize coupling of transistor output power from the PAR driver transistors 1274a, 1274b, 1274c into the cavity-combiner 1310. The current driving transistors 1274a . . . 1274j drive RF power via a current probe 1352 that is part of the capacitive coupler 1350. The current probe 1352 drives the RF power into the cavity combiner 1310 and are mounted on printed circuit boards 1274a' . . . 1274j' (see FIG. 8). The current probes 1352 also provide bias voltage for the transistors 1274a . . . 1274j. The current driving transistor output power is transmitted via a center conductor 1312 illustrated in the form of a rod or shaft that projects into the cavity-combiner 1310. The open end of cylindrical section 1330 at distal end 1320d interfaces with an antenna coupler 1410 that is in electromagnetic communication with the center conductor 1312. The electromagnetic wave power 1015 transmitted from the center conductor 1312 is received by the antenna coupler 1410. In one embodiment, distal end 1314 of center conductor 1312 is ball-shaped.

The inner cylindrical wall 1322 of the λ/4 coaxial-cavity section 1320 further defines an internal volume 1340 within the λ/4 coaxial-cavity section 1320 of the cylindrical section 1330. The internal volume 1340 extends from the proximal end 1320 a to distal end 1320c within the interior volume 1330' and defines an aperture 1342 at the proximal end 1320a that extends to circular wall 1344 at distal end 1320c. The PAR 1300 and PAR driver 1260 in the HPM system 100' may also be considered to be an antenna driven by a hybrid HPSSA, i.e., the HPSSA 1200, that includes a PAR driver arborescent 1:N distributor input 1010 and a PAR N:1 cavity combiner 1310 output 1016 with PAR driver transistors 1274a, 1274b, 1274c . . . 1274j as the amplifying elements (see FIG. 6). The PAR driver 1260 includes PAR driver impedance transformers 1276a and 1276b that interface with the PAR driver transistors 1274a, 1274b, 1274c . . . 1274j. The cavity-combiner 1310 is configured to include the λ/4 coaxial-cavity section 1320 and cylindrical section 1330. An RF energy coupler 1350 is positioned at a distance 1320b distally from power input end 1320a and proximal from the inner cylindrical wall 1344 of the λ/4 coaxial-cavity section 1320 to maximize coupling of transistor output power from the PAR driver transistors 1274a, 1274b, 1274c into the cavity-combiner 1310. The current driving transistors 1274a . . . 1274j drive RF power via a current probe 1352 that is part of the RF energy coupler 1350. Current probes 1352 drive the RF power into the cavity combiner 1310 and are mounted on printed circuit boards 1274a' . . . 1274j' (see FIG. 8). The current probes 1352 also provide bias voltage for the transistors 1274a . . . 1274j. The current driving transistor output power is transmitted via a center conductor 1312 illustrated in the form of a rod or shaft that projects into the cavity-combiner 1310.

The open end of cylindrical section 1330 at distal end 1320d interfaces with a capacitive coupler 1410 that is in electromagnetic communication with the center conductor 1312. The electromagnetic wave power 1015 transmitted from the center conductor 1312 is received by the capacitive coupler 1410. In one embodiment, distal end 1314 of center conductor 1312 is ball-shaped.

In one embodiment, the capacitive coupler 1410 includes an electric field receiver or RF energy coupling and impedance matching element 1412 in the form of a disk-shaped plate 1414 that is positioned at a right angle to distal end 1314 of center conductor 1312. In still another embodiment, the electric field receiver or RF energy coupling and impedance matching element 1412 further includes an open-ended cylindrical wall 1416 that extends proximally from the plate 1414 to define an interior volume 1416' into which the distal end 1314 of center conductor 1312 extends. The electric field receiver or RF energy coupling and impedance matching element 1412 is a RF energy coupling and impedance matching element due to its pre-determined geometry and design.

The disk-shaped plate 1414 is in electrical communication with an antenna conductor element 1418 that transmits the electric field to phased-array antenna 1400 via a coaxial conductor 1420. Directed energy propagates distally from the antenna 1400 at distal end 1020 of the HPM system 100 or 100'. The antenna 1400 radiates a high power electromagnetic wave of which power is coupled through end launching ridge 1422.

The cavity-combiner section 1310, quarter wave ($\lambda/4$) coaxial-cavity section 1320 and cylindrical section 1330 enable the cylindrical section 1330 dimensions to be equal to the phased array cell size. The capacitive coupler 1410 between the antenna 1400 and the cavity-combiner 1310 enable the field in the cylindrical section 1330 to be below breakdown without the need for dielectric inserts inside of the cylindrical section 1330. The $\lambda/4$ coaxial section 1320 maintains the RF open at the slot 1328a ... 1328h while creating a DC enclosure for the cavity-combiner 1310 and a heat sink for the PAR driver 1260. The number and type of transistors 1274a ... 1274N can be chosen in order to achieve an intended effective radiated power (ERP) and system footprint requirements.

However, the coupling between the antenna center conductor 1312 and the cavity-combiner 1310 suggests that the antenna 1400 and the cavity-combiner 1310 may be taken as one unit with the 1:N distributor 1270 and PAR driver transistors 1274a, 1274b, 1274c constituting a PAR driver for the PAR 1300. Thus, the PAR 1300 is closer to being an antenna with multiple low impedance inputs 1015a, 1015b, 1015c, with the cavity-combiner 1310 serving as impedance transformer and multiport input to the radiating component, i.e., the antenna 1400. These low impedance inputs 1015a, 1015b, 1015c can then be driven by multiple low impedance drivers, e.g. PAR driver transistors 1274a, 1274b, 1274c. With this perspective, the components included in the PAR 1300 are seen as an efficient way to combine and radiate the output power of N transistors 1274a, ... 1274N drivers (wherein in the example illustrated in FIG. 6, N=j=10) with excellent overall phase/delay characteristics. More importantly, these components are designed to have the same footprint as the phased-array unit cell section, dimension D in FIG. 5, a critical design characteristic that makes practicable the integration of these elements into a useful system. Details of the PAR 1300 physical layout, operating characteristics, drivers, DC power supply, integration into various systems and design challenges are discussed in the following sub-sections.

As indicated above, FIG. 8 is a cross-sectional view of the PAR Driver 1260 and PAR 1300 taken along section line 8-8 in FIG. 7 with the 1:N way arborescent distributor 1270 not shown. In FIG. 8, the design and physical layout of the PAR 1300 and the low impedance PAR driver 1260 are further illustrated. Within the internal volume 1340 within the $\lambda/4$ coaxial-cavity section 1320 of the cylindrical section 1330, transistors 1274a ... 1274j are mounted respectively on printed circuit boards 1274a' ... 1274j', which in turn are mounted on metal fins 1350a ... 1350j, respectively. The metal fins 1350a ... 1350j, extend from inner cylindrical wall 1322 radially inwardly towards resonator 1344 at the center of cylindrical section 1330. The printed circuit boards 1274a' ... 1274j' extend radially outwardly from a position generally at the mid-point of the metal fins 1350a ... 1350j to beyond outer wall 1330b of the cylindrical section 1330

(see FIG. 6) to form RF energy couplers 1350a ... 1350j. The $\lambda/4$ coaxial-cavity section 1320 is designed to maintain the RF open at the slots 1328a ... 1328j between the current probes 1352 while creating a DC enclosure for the cavity-combiner 1310 and a heat sink for the PAR driver 1260.

The radial dimension radius R of the PAR 1300 may be in the range of about 4 cm, with a total weight of about 0.55 kg (about 1.2 lbs).

The 1:N divider 1270 and the cavity combiner 1310 efficiently drive the input RF power 1010 and combine the output power 1015 of the N power transistors 1274a ... 1274N, thereby yielding an amplifier output power 1015 that is N-times the input RF power 1010. The high power cavity combiner 1310 is coupled to the antenna 1400 through the capacitive coupler 1410 in a manner so as to optimize cavity performance and antenna coupling.

Figure 9:
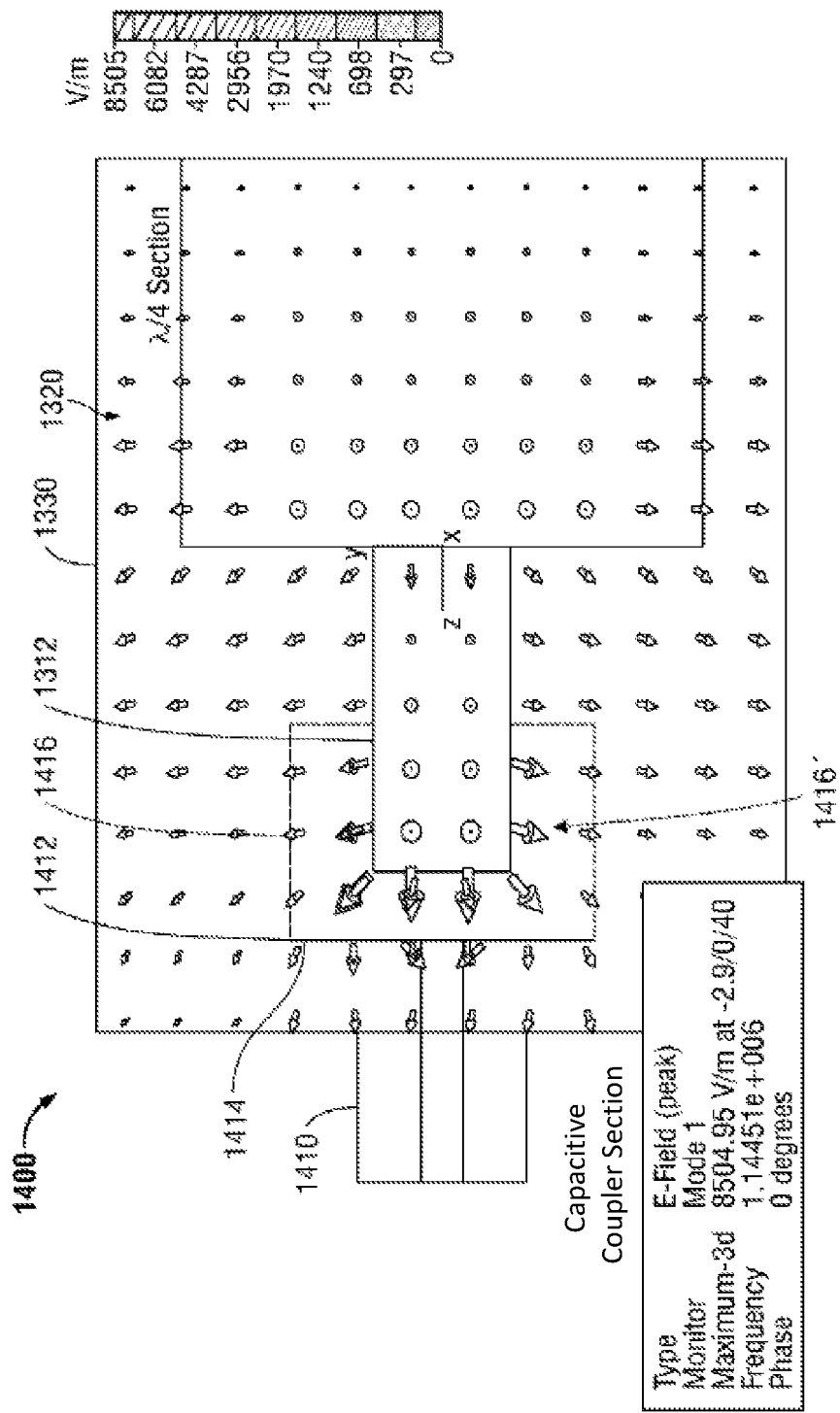
FIG. 9 is a CST simulation of field distribution within a cavity-combiner of the PAR driver and PAR of FIG. 7 according to one embodiment of the present disclosure.

FIG. 9 is an analytical simulation of the microwave distribution in the PAR 1300 and PAR driver 1260 resulting from the operation of the PAR driver, including interfacing between the impedance transformers 1276a, 1276b, biasing circuits1272a, 1272b and transistors 1274a ... 1274j.

Figure 10:
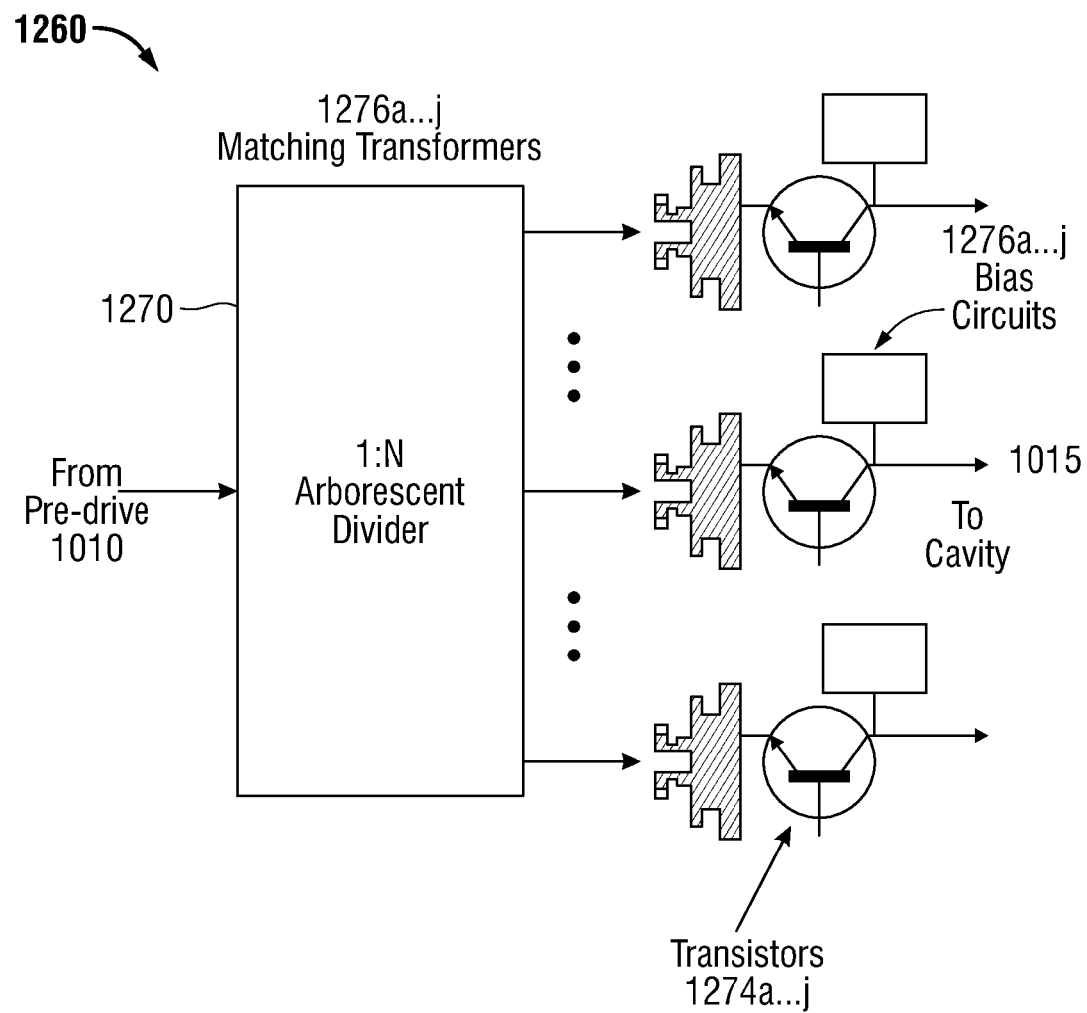
FIG. 10 is a block diagram of the PAR driver according to one embodiment of the present disclosure.
Figure 12:
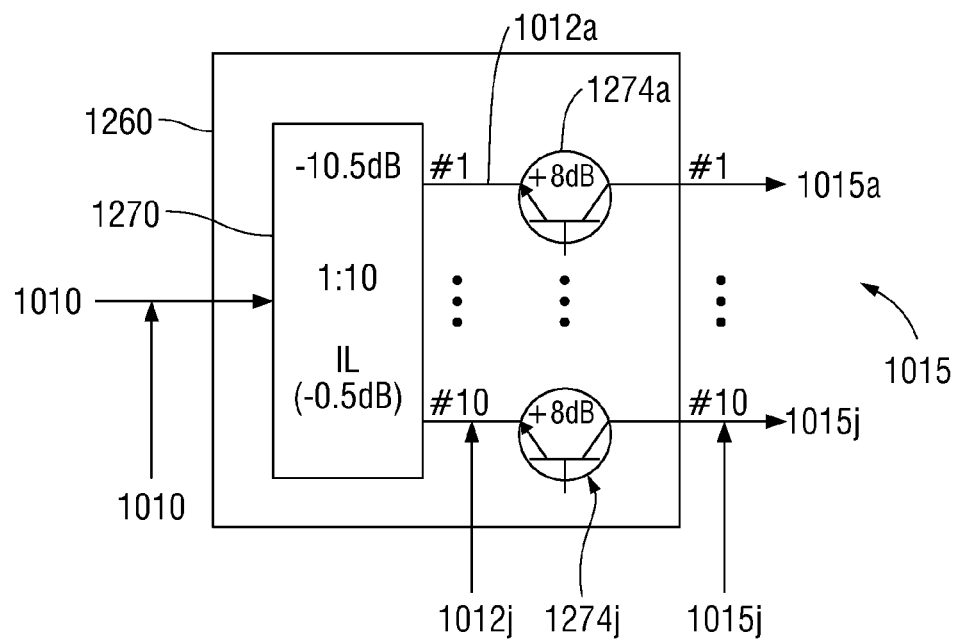
FIG. 12 is a functional schematic diagram of the PAR driver according to one embodiment of the present disclosure.

A schematic diagram of the PAR driver section 1260 is shown in FIGS. 10, 11, 12. The matching transformers 1276a ... 1276j interconnecting strip lines 1282a ... 1282j, DC bias circuitry 1272a ... 1272j and the transistors 1274a ... 1274j are each laid out in fins 1280a ... 1280j, respectively, extending radially outwardly from center 1280, as shown in FIG. 8. The 1:N divider 1270 is laid out on circular disk 1271, see FIG. 11, and placed on mounting metal footings 1284a ... 1284j. Above the footings 1284a ... 1284j are connectors 1286a ... 1286j that respectively receive the radially extending interconnecting strip lines 1282a ... 1282j, as shown in FIG. 11.

The transformers 1276a ... 1276j match the high output impedance (50 ohms) of the divider 1270 to the low input impedance (~1ohm) of the transistors 1274a ... 1274j. The DC biasing circuitry 1272a ... 1272j includes a low power emitter bias circuit (for maximally efficient class-C operation) and a high power circuit, to supply the V<< to the collector. At the location of each transistor 1274a ... 1274j the biasing circuit 1272a ... 1272j has a large capacitor to provide the required energy for RE pulse operation. Referring to FIG-12, the high power solid state transistors 1274a ... 1274j each receive a power 1012a ... 1012j from the 1:N power distributor 1270 which is transmitted as an output power 10156a ... 1015j to the cavity combiner 1310 after the amplification by the transistors 1274a ... 1274j.

As previously noted, the 1:N distributor 1270 in the PAR driver 1260 is of the arborescent type, which since it is in the low power section of the driver, power losses in the distributor are small. Moreover, control of phase-characteristics in the distributor is within a few degrees. The 1:N distributor 1270 offers advantages over other types of distributors in the weight and footprint.

Figure 13:
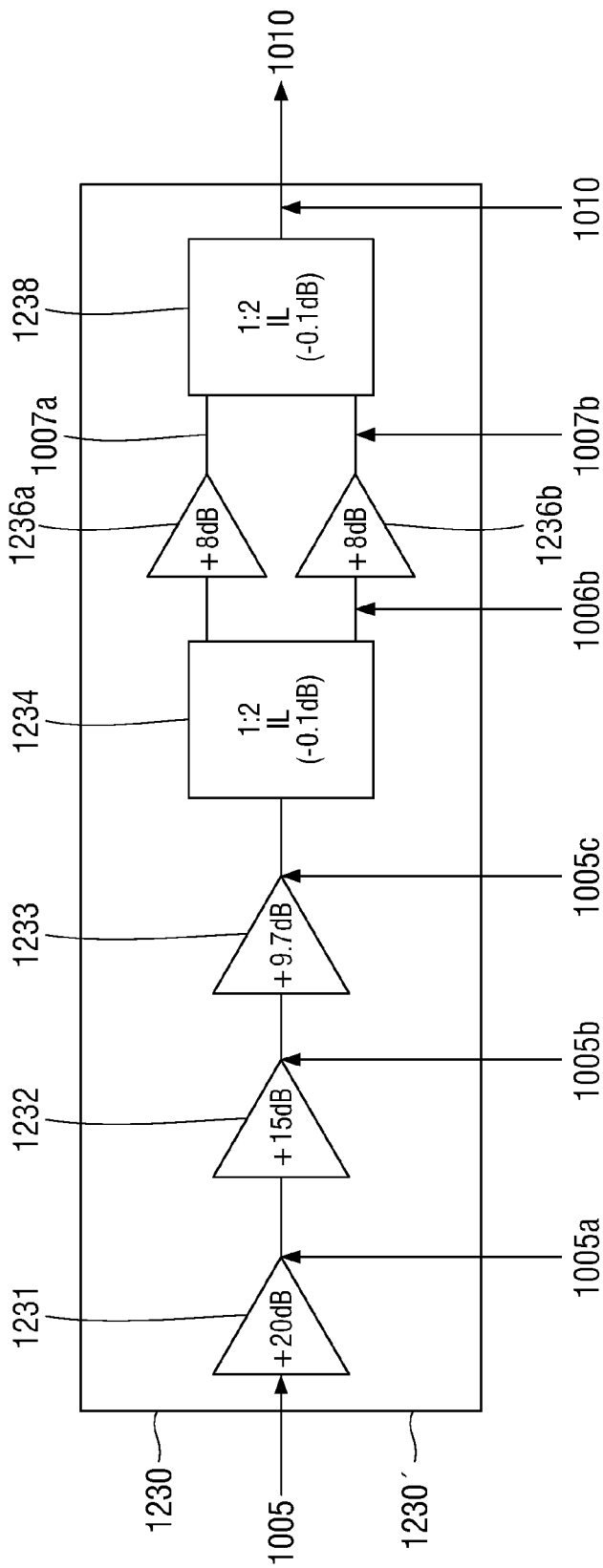
FIG. 13 is a functional schematic diagram of a PAR pre-driver of the HPM system of FIGS. 4 and 5 according to one embodiment of the present disclosure.

FIG. 13 illustrates a schematic diagram of PAR pre-driver 1230. The PAR pre-driver 1230 receives input power 1005 from the RF source/pulse generator 1002. The components of the PAR pre-driver 1230 are mounted on a board 1230' and include a first amplifier 1231 that directly receives the input power 1005. The amplifier 1231 boosts to power level 1005a as input to second amplifier 1232, which in turn boosts to power level 1005b that, in turn, is received by third amplifier 1233, which in turn boosts to power level 1005c. First 1:2 divider 1234 receives the power from third amplifier 1233 at power level 1005c and divides the power into a first power path 1006a that is input to a first amplifier 1236a and into a parallel second power path 1006b that is input into a second amplifier 1236*b*. Power output 1007*a* from first amplifier 1236*a* and parallel power output 1007*b* from second amplifier 1236*b* are combined in 2:1 combiner 1238, from which power 1010 is output to the PAR driver 1260.

Figure 14:
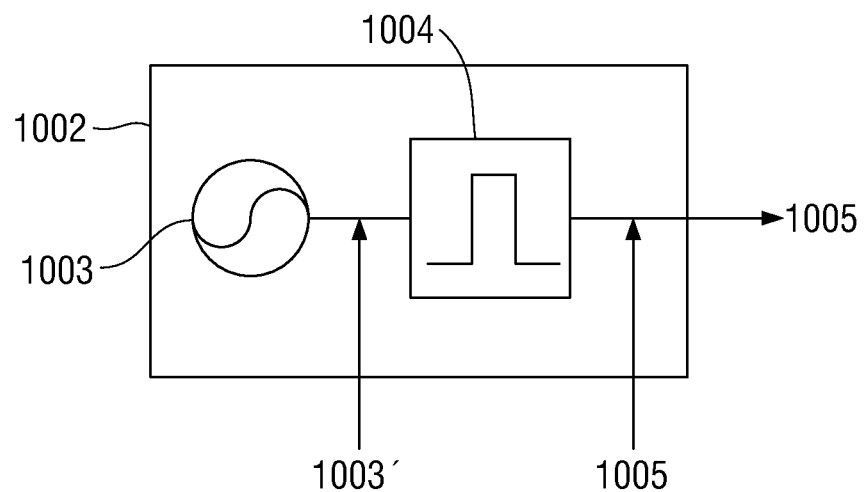
FIG. 14 is a functional schematic diagram of an RF pulse generator of the HPM system of FIGS. 4 and 5 according to one embodiment of the present disclosure.

FIG. 14 is schematic diagram of the RF source/pulse generator 1002. The RF source/pulse generator 1002 includes a crystal oscillator 1003 whose output 1003' is shaped by wave-form generator 1004 into power output 1005 that is received by the PAR pre-driver 1230.

Figure 15:
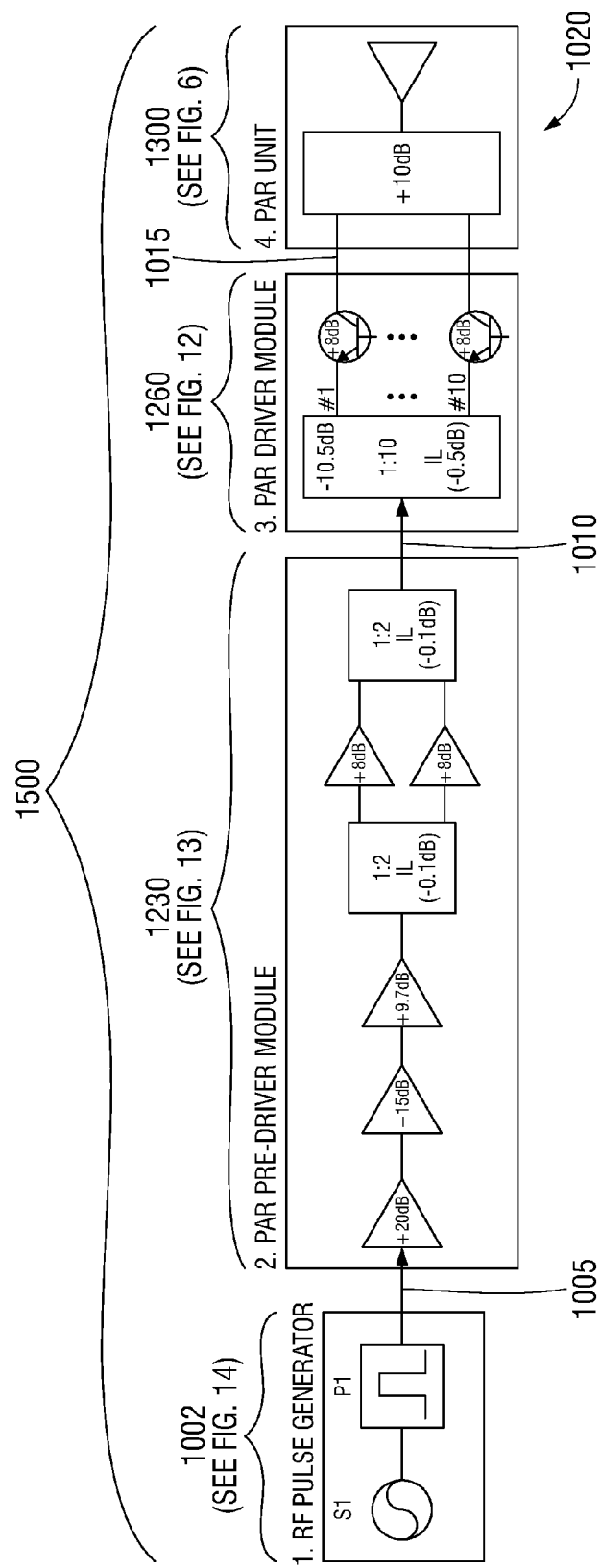
FIG. 15 is a functional schematic diagram of a single array-element system that includes the power amplifying radiator (PAR) technology according to one embodiment of the present disclosure.

FIG. 15 is schematic diagram of the RF source/pulse generator 1002, the PAR pre-driver 1230, the PAR driver 1260 and the PAR 1300 integrated into a single array element system 1500.

Figure 16:
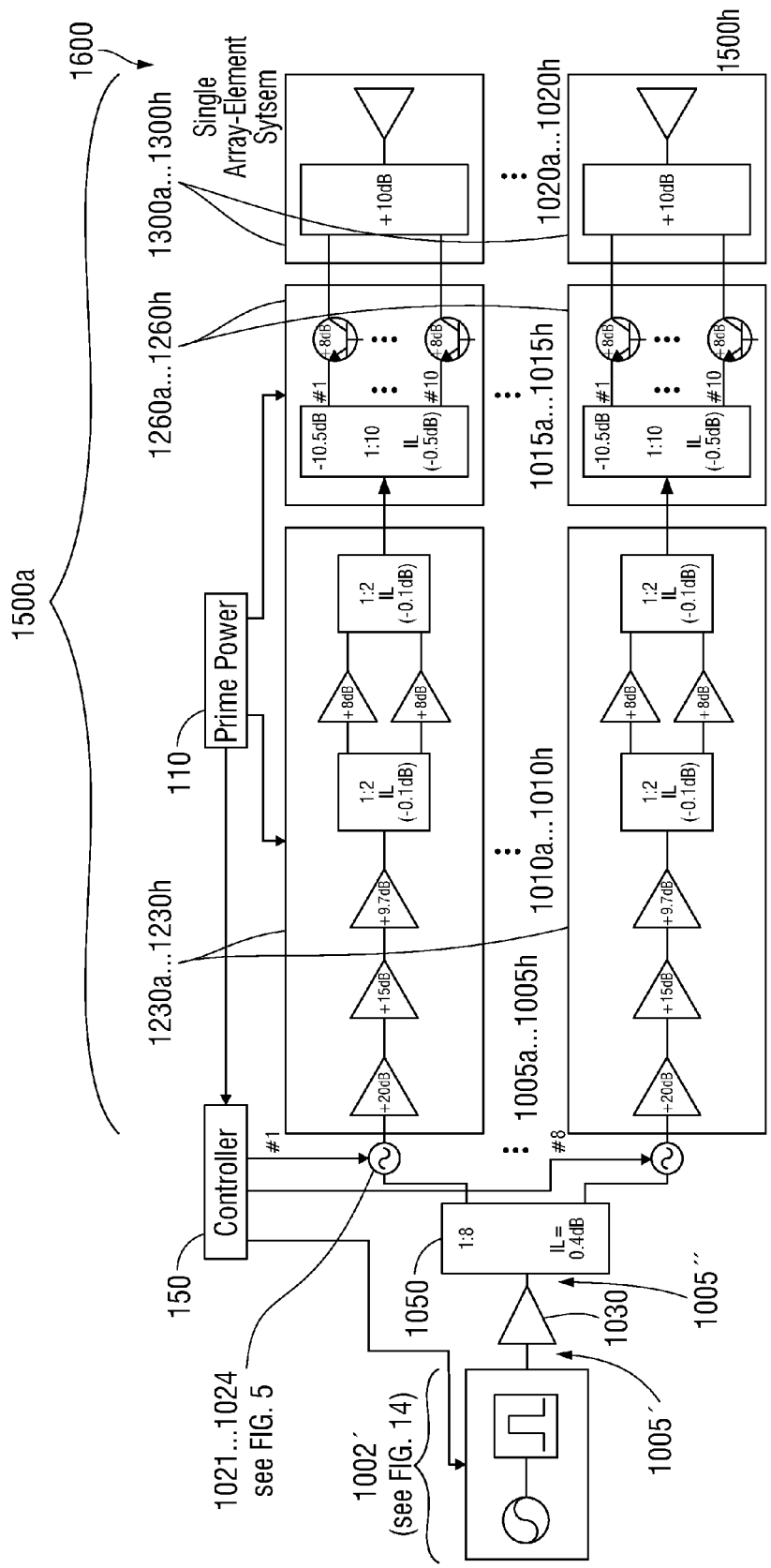
FIG. 16 is a top-view functional schematic diagram of a scalable 1×N (N=8) phased-array HPM system that includes the power amplifying radiator (PAR) technology according to one embodiment of the present disclosure.

FIG. 16 is schematic diagram a scalable 1×N phased-array system 1600 that includes, as part of each array, phased sub-system 1500*a* . . . 1500*h* that is comprised of PAR pre-driver 1230, PAR driver 1260 and PAR 1300 integrated into 1×N array element systems 1500*a* . . . 1500*h*.

Scalable 1×N phased-array system 1600 further includes a common RF source/pulse generator 1002' that supplies output power 1005' to a common amplifier 1030. Power output 1005" from common amplifier 1030 is received by 1:N divider 1050 that divides the power into individual power inputs 1005*a* . . . 1005*h* to phase shifters 1021 . . . 1024 in FIG. 5.

Power is output from PAR pre-drivers 1230*a* . . . 1230*h* as power outputs 1010*a* . . . 1010*h* which in turn is output from PAR drivers 1260*a* . . . 1260*h* as power outputs 1015*a* . . . 1015*h*, and which in turn is output from PAR 1300*a* . . . 1300*h* as power outputs 1020*a* . . . 1020*h*.

In view of the foregoing with reference to FIGS. 3-16, those skilled in the art will recognize that the present disclosure relates, in one embodiment, to a high power microwave system 100' that includes power amplifying radiator 1300 that includes RF energy coupling and impedance matching element 1412, capacitive coupler 1410, cavity combiner 1310 providing electromagnetic communication with the capacitive coupler and antenna 1400, wherein the RF energy coupling and impedance matching element is in electromagnetic communication with the antenna via the cavity combiner.

The system 100' may include power amplifying radiator driver 1260 in electromagnetic communication with the power amplifying radiator 1300, wherein the cavity combiner 1310 has a cross-sectional dimension equal to a unit cell dimension of the phased-array antenna. The capacitive coupler 1410 excludes dielectric material and a magnitude of an electric field propagating through the coupler is such that the magnitude of the electric field is less than a breakdown voltage of the electric field propagating through the capacitive coupler.

The power amplifying radiator driver 1260 provides power input to the cavity combiner wherein the power in the cavity combiner is greater than the power to the antenna. The power amplifying radiator driver 1260 may include arborescent 1:N distributor 1270 embedded in multi-layered disk 1271, N interconnecting strip lines 1282*a* . . . 1282N embedded in the multi-layered disk, N respective impedance transformers 1276*a* . . . 1276N and N transistors 1274*a* . . . 1274N, each receiving an electrical signal from the respective N impedance transformers. The N impedance transformers match output impedance of the N interconnecting strip lines to input impedance to the respective N transistors, the output impedance of the N interconnecting strip lines being greater than the input impedance to the respective N transistors. The power amplifying radiator driver 1260 may further include N biasing circuitry 1272*a* . . . 1272N in electrical communication with the respective N transistors each receiving an electrical signal from the respective N impedance transformers.

The respective N transistors that each may receive an electrical signal from the respective N impedance transformers may be 10 transistors each receiving an electrical signal from respective 10 impedance transformers.

In one embodiment, the antenna is a horn antenna, or in one embodiment, the antenna is a patch antenna.

The present disclosure relates, in one embodiment, to power amplifying radiator 1300 power amplifying radiator 1300 that includes RF energy coupling and impedance matching element 1412, capacitive coupler 1410, cavity combiner 1310 providing electromagnetic communication with the capacitive coupler and antenna 1400, wherein the RF energy coupling and impedance matching element is in electromagnetic communication with the antenna via the cavity combiner.

In one embodiment, the present disclosure relates also to high power solid state amplifier 1200 that includes low power strip-line power distributor 1270, high power cavity combiner 1310, and N power-transistors 1274*a* . . . 1274N coupled to the low power strip-line power distributor, wherein the high power solid state amplifier drives an input power and combines output powers of the N power-transistors, thereby yielding an output power that is greater than input powers to the N power-transistors, and wherein the high power cavity combiner is coupled to an antenna component through a capacitive coupler.

While several embodiments and methodologies of the present disclosure have been described and shown in the drawings, it is not intended that the present disclosure be limited thereto, as it is intended that the present disclosure be as broad in scope as the art will allow and that the specification be read likewise. Therefore, the above description should not be construed as limiting, but merely as exemplifications of particular embodiments and methodologies. Those skilled in the art will envision other modifications within the scope of the claims appended hereto.

What is claimed is:

1. A high power microwave system comprising:
a power amplifying radiator including:
a radio-frequency (RF) energy coupling and impedance matching element;
a capacitive coupler;
a cavity combiner including a coaxial-cavity section providing electromagnetic communication with the capacitive coupler; and
an antenna;
wherein the RF energy coupling and impedance matching element is in electromagnetic communication with the antenna via the cavity combiner,
the cavity combiner including a center conductor configured and disposed to project from the coaxial-cavity section such that the cavity combiner defines a co-axial cross-sectional configuration.

2. The system according to claim 1, further comprising:
wherein the antenna is a phased-array antenna,
a power amplifying radiator driver in electromagnetic communication with the power amplifying radiator, wherein the cavity combiner has a cross-sectional dimension equal to a unit cell dimension of the phased-array antenna.

3. The system according to claim 1, wherein the capacitive coupler excludes dielectric material and a magnitude of an electric field propagating through the capacitive coupler is such that the magnitude of the electric field is less than a breakdown voltage of the electric field propagating through the capacitive coupler.

4. The system according to claim 2, wherein the capacitive coupler excludes dielectric material and a magnitude of an electric field propagating through the capacitive coupler is such that the magnitude of the electric field is less than a breakdown voltage of the electric field propagating through the capacitive coupler.

5. The system according to claim 2, wherein the power amplifying radiator driver provides power input to the cavity combiner wherein the power in the cavity combiner is greater than the power to the antenna.

6. The system according to claim 2, wherein the power amplifying radiator driver includes:
   an arborescent 1:N distributor embedded in a multi-layered disk;
   N interconnecting strip lines embedded in the multi-layered disk;
   N respective impedance transformers; and
   N transistors each receiving an electrical signal from the respective N impedance transformers,
   the N impedance transformers matching output impedance of the N interconnecting strip lines to input impedance to the respective N transistors, the output impedance of the N interconnecting strip lines greater than the input impedance to the respective N transistors.

7. The system according to claim 6, wherein the power amplifying radiator driver further comprises N biasing circuitry in electrical communication with the respective N transistors each receiving an electrical signal from the respective N impedance transformers.

8. The system according to claim 6, wherein the respective N transistors each receiving an electrical signal from the respective N impedance transformers are 10 transistors each receiving an electrical signal from respective 10 impedance transformers.

9. The system according to claim 1, wherein the antenna is one of a horn antenna and a patch antenna.

10. A power amplifying radiator comprising:
    a radio-frequency (RF) energy coupling and impedance matching element;
    a capacitive coupler;
    a cavity combiner including a co-axial cavity section providing electromagnetic communication with the capacitive coupler; and
    an antenna;
    wherein the RF energy coupling and impedance matching element is in electromagnetic communication with the antenna via the cavity combiner,
    the cavity combiner including a center conductor configured and disposed to project from the coaxial-cavity section such that the cavity combiner defines a co-axial cross-sectional configuration.

11. A high power solid state amplifier comprising:
    A low power strip-line distributor,
    A high power cavity combiner, and
    N power-transistors coupled to said low power strip-line distributor;
    wherein the high power solid state amplifier drives a power input to the low power strip-line distributor, each transistor of N power-transistors receive an input power from the low power strip-line power distributor and transmit as a power output to the high power cavity combiner, thereby yielding the output power to the high power cavity combiner that is N-times greater than the input power received from the power strip-line distributor, and wherein the high power cavity combiner is coupled to an antenna component through a capacitive coupler.

* * * * *